United States Patent
Memmi

(10) Patent No.: US 7,493,247 B2
(45) Date of Patent: Feb. 17, 2009

(54) INTEGRATED CIRCUIT ANALYSIS SYSTEM AND METHOD USING MODEL CHECKING

(75) Inventor: Gerard Memmi, Cambridge, MA (US)

(73) Assignee: DAFCA, Inc., Framingham, MA (US)

( * ) Notice: Subject to any disclaimer, the term of this patent is extended or adjusted under 35 U.S.C. 154(b) by 330 days.

(21) Appl. No.: 11/295,787

(22) Filed: Dec. 7, 2005

(65) Prior Publication Data

US 2007/0168730 A1    Jul. 19, 2007

(51) Int. Cl.
*G06F 17/50*    (2006.01)
*G06F 9/455*    (2006.01)
(52) U.S. Cl. .............................. 703/14; 703/27; 716/4
(58) Field of Classification Search .................. 703/20, 703/21, 27, 13, 14, 26; 716/2–8; 717/127, 717/140
See application file for complete search history.

(56) References Cited

U.S. PATENT DOCUMENTS 7,137,086 B2 * 11/2006 Abramovici .................. 716/4
7,305,635 B1 * 12/2007 Abramovici et al. ........... 716/4

* cited by examiner

*Primary Examiner*—Thai Phan
(74) *Attorney, Agent, or Firm*—McDermott Will & Emery LLP

(57) ABSTRACT

A method and system for verifying an integrated circuit using a Model Checker at post-silicon time to improve post-silicon assertion-based verification. A dialog is established between the Model Checker and a fabricated integrated circuit under test (ICUT), to increase the state space which is explored. ICUT-based traces from the integrated current are generated, in part based on initial states and assertions provided by the Model Checker or by a user. The Model Checker verifies the integrated circuit by generating Model Checker-based traces from basic logic, which are reproductions of the ICUT-based traces.

18 Claims, 7 Drawing Sheets

INTEGRATED CIRCUIT ANALYSIS SYSTEM AND METHOD USING MODEL CHECKING

FIELD OF THE INVENTION

This invention relates to apparatus for and methods of analyzing integrated circuits, and more particularly, to apparatus and methods using a Model Checker to analyze and verify integrated circuits.

BACKGROUND OF THE INVENTION

Verification of an integrated circuit design typically involves testing the circuit design before the design is physically implemented as a circuit on a chip, so that bugs in the circuit design can be identified before the expense of fabrication occurs. Conventional verification methods generally use software simulation tools to verify design models at different levels of description of the circuit design such as an RTL (Register Transfer Logic) description of the circuit design, a layout of the circuit design, etc.

Because most of the system-on-chip designs include relatively large, fast and complex integrated memories, on-chip buses, and sophisticated modules or cores, simulation of descriptions of a circuit design has become increasingly time consuming, complex and difficult. Furthermore, simulation of high levels of abstraction of a circuit design cannot guarantee accuracy with regard to a physical circuit fabricated on the chip according to the corresponding high level models.

Verifying the actual hardware circuit and debugging the hardware circuit (also called silicon debug) are difficult and costly problems that delay volume production and market entry. The major reason for these difficulties resides in the lack of control and visibility over critical signals.

In the prior art, an important tool for verification of integrated circuits is referred to as "Model Checking". Model Checking is a formal verification technique introduced around 1981 in various theoretical works: E. M. Clarke and E. A. Emerson "Design and synthesis of synchronization skeletons using branching time temporal logic." In Logic of Programs: Workshop, Yorktown Heights N.Y. LNCS 131 Springer Verlag May 1981; J.-P. Queille and J. Sifakis "Specification and Verification of Concurrent Systems in Cesar." Int. Symp. On Programming LNCS 132 Springer Verlag 1982. However, it was industrialized and used for hardware verification only in the late 90's http://www.eet.com/news/98/1024news/blda.html.

Basically, a Model Checker is a software tool which explores states reachable from an initial state of a transition system, to check whether an "assertion" is verified, or proven, for all reachable states, or whether the assertion fails for some states. In the latter case, the tool is able to define and exhibit a "trace", i.e. a sequence of reachable states starting from the initial state to a failure (state where the assertion fails).

When applied to integrated circuit design, a Model Checker reads in:

a design description for an integrated circuit, which contains state elements, primary inputs (PIs), and primary outputs (POs),
a set of constraints C (optional),
an initial state I,
at least one assertion to be proven over the entire reachable state space.

A state s is defined as a Boolean function over all state elements, (including PIs, and POs) of the design. A state s is reachable from state I if and only if there exists a sequence of "transitions" which goes from I to s with respect to the set of constraints C, where a transition is defined as the functioning of the design for one cycle. A "deep" trace extends over a relatively long sequence of transitions with a large number of different states (no regular repetition of transitions).

In operation, a Model Checker starts compiling a design description, constraints and one or more assertions, into a basic logic format, which is used to compute states and evaluate assertions. After the basic logic is determined, the Model Checker progresses in its exploration of the entire reachable state space starting from the initial state. At each current state, it:

computes all possible next states from a current state respecting the constraints C,
compares all new states to the already reached states to decide if it has already been explored or not; marks all new states accordingly, as explored or not.
evaluates the assertion to be proven as true or false in any new state,
marks the current state as "explored" and picks a new current state among the reached and unexplored states, and
stops when all states have been explored, or after predetermined processing time limit has been reached.

Due to the complexity of integrated circuits, in practice, a Model Checker often does not finish its exploration (over all possible states) because it has to consider too many states (known as "state explosion" in the literature); instead, a limited subset of the reachable state space is explored, limited by the processing time limit.

Conventional formal verification tools operate on a description of a circuit design and do not directly operate on a fabricated circuit on a chip. There is a need for a new apparatus and method for analyzing and debugging integrated circuits, which uses control and visibility provided by tools like a Model Checker, together with speed and accuracy which can be provided by processing on an actual chip.

SUMMARY

The present invention provides systems for and methods of analyzing user logic in an integrated circuit. The invention uses information, generally in the form of signals, received directly from an integrated circuit under test (ICUT), in conjunction with a Model Checker, in effect establishing a dialog between the ICUT and the Model Checker. The term "integrated circuit under test" includes Field Programmable Gage Arrays (FPGAs) as well as non-field-programmable integrated circuits. In this document, a region of an ICUT is defined as a module, or a core module, or more generally as a subset of the circuit that has a self-contained meaning for the user or the designer of the circuit, for instance a finite state machine, or a pair of modules with glue logic. An ICUT which may be tested, and/or analyzed, and/or verified, with the present invention includes a reconfigurable logic for providing visibility and control to selected signals to be tested, for example having user logic regions for performing desired functions. The user logic may or may not have regions that may be logically reconfigured in response to applied signals. Examples of integrated circuits using reconfigurable logic for testing purposes are disclosed in U.S. patent application Ser. Nos. 10/425,101 and 10/956,854, assigned to the assignee of the present invention.

The ICUT includes a user logic (UL) region and a debug logic (DL) region. The user logic (UL) region includes a logic circuit operable synchronously with an applied periodic clock. The logic circuit has a plurality of nodes and one or more UL signal lines, each of these UL signal lines extending from an associated one of said nodes. Signals on one or more of said UL signal lines are representative of binary values at the associated nodes as a function of time.

The debug logic (DL) region includes a tracer, a reconfigurable logic including a reconfigurable router and a reconfigurable test logic. The reconfigurable logic has one or more reconfigurable logic (RL) input lines coupled to the reconfigurable router. The tracer has one or more tracer (T) input lines. The tracer is responsive to signals on one or more of the T input lines to generate ICUT-based traces, where the ICUT-based traces are representative of a succession of states of the user logic circuit over a plurality of clock periods.

The reconfigurable router is responsive to an applied router configuration signal to couple selected ones of the UL signal lines to selected ones of the T input lines.

The reconfigurable logic is responsive to an applied assertion analysis control signal to generate an assertion evaluation signal which is representative of an evaluation of one or more applied assertions over a succession of clock cycles.

In an alternative form aspect of the invention, the tracer is reconfigurable in response to an applied tracer configuration signal. The reconfigurable logic is responsive to an applied tracer control signal to generate the tracer configuration signal and to apply the tracer configuration signal to said tracer. In accordance with this aspect of the invention, the controller is responsive to direct user directives or to the model checker engine to generate the tracer control signal and apply the tracer control signal to the reconfigurable logic.

In another aspect of the invention, the ICUT further includes controlling logic coupled to one or more of the UL signal lines. The controlling logic is responsive to an applied initial state signal to generate a UL control signal and apply the UL control signal to the UL region to effect the initial state in said UL region. The Controller is responsive to the Model Checker engine to generate the initial state signal and is adapted to apply the initial state signal to the controlling logic. Further, the controlling logic may be reconfigurable in response to a controlling logic signal from the Controller, and wherein the Controller is responsive to the model checker engine to generate the controlling logic signal and is adapted to apply the initial state signal to the controlling logic.

The debug logic (DL) region is responsive to an applied configuration signal to stimulate selected signals to the UL (for the UL to start with a given initial state), or to implement and evaluate an assertion in terms of selected signals from the UL, or to couple selected ones of the UL input lines and UL output lines to selected ones of the T input lines. The tracer is responsive to signals on one or more of the T input lines to generate an ICUT-based trace on one or more of the T output lines.

According to one aspect of the present invention, a system for analyzing user logic in an ICUT includes a Model Checker compiler, a Model Checker engine and a Controller.

The Model Checker compiler is responsive to an applied design description for the ICUT, zero, one or more applied constraints C, an applied initial state I, and one or more applied assertions, to generate basic logic.

The Model Checker engine is responsive to the basic logic to construct a reachable state graph extending from the initial state and is representative of a plurality of reachable states for the design description. The Model Checker engine evaluates the assertions over a subset of the states reachable from the initial state. The Model Checker engine has the capability to evaluate assertions over a subset of states reachable from an initial state, and can generate Model Checker-based traces.

The Controller is responsive to the basic logic relative to C, I and the assertions to generate the configuration signal for application to the debug logic (DL) of the ICUT. The Controller transfers the router configuration signal to the debug logic region of the ICUT, whereupon the router is reconfigured accordingly. The Controller receives the traces from the ICUT and transfers those signals (generally with some formatting) to the Model Checker engine. The controller is responsive to the Model Checker engine to generate the assertion analysis control signal and apply that signal to the reconfigurable logic. The controller is also able to respond to direct user inputs and generate corresponding configuration and control signals.

According to one aspect of the invention, the Model Checker engine processes the basic logic in an effort to generate a Model Checker-based trace which is identical to, or equivalent in material respects to, the ICUT-based trace. In effect, the Model Checker engine compares the ICUT-based traces to the Model Checker-based traces and draws conclusions based on that "comparison". When the comparison results in a failure to match (a "non-match") then a failed assertion is said to have occurred, the failure of an assertion can be detected "on-chip" in the reconfigurable logic, for example, or can be detected in the Model Checker, for example, when the assertion is complex and has not been configured in the reconfigurable logic.

In one form, the Model Checker engine is responsive to the evaluation of the Model Checker-based and ICUT-based traces and generates a new initial state, and provides the new initial state to the Controller. In this form, the Controller is responsive to the applied new initial state and generates new configuration signals and for applying the new configuration signals to the DL region of the ICUT.

According to another aspect of the invention, the Model Checker engine is responsive to the analysis of the Model Checker-based and ICUT-based traces and generates a new assertion, and applies the new assertion to the Controller. In this form, the Controller is responsive to the applied new assertion and generates a new configuration signal and applies the new configuration signal to the DL region of the ICUT.

According to another aspect of the invention, the Model Checker engine is responsive to the analysis of the Model Checker-based and ICUT-based traces and generates a new initial state and a new assertion, and applies the new initial state and the new assertion to the Controller. In this form, the Controller is responsive to the applied new initial state and the new assertions and generates a new configuration signal and applies the new configuration signal to the DL region of the ICUT.

According to another aspect of the invention, the Model Checker engine is responsive to a received ICUT-based trace having an assertion failure associated with a state of the ICUT associated with the failed assertion. The Model Checker engine determines a new initial state corresponding to a state of the ICUT prior to the state associated with the assertion failure in the ICUT-based trace and constructs a new graph from the new initial state with the expectation to establish more traces and find more states where said assertion failure appears.

According to another aspect of the invention, the Model Checker engine, is responsive to the received ICUT-based trace to determine a new initial state, and use the new initial state to restart its exploration algorithm. It then evaluates the assertion over a new subset of the states reachable from the new initial state, and may generate a Model Checker-based trace representative of the evaluations of the assertion over the new subset, possibly reaching a state of interest for starting to run the ICUT.

In both of the latter aspects of the invention, the Model Checker engine may compare Model Checker-based and ICUT-based traces and generate and apply to the Controller new initial states, new assertions or both, as described above.

In one form, the operational flow has a fundamental loop: During its analysis, the Model Checker sends some information that is driving a new run of the ICUT under the control of the silicon debug tool in the debug logic (DL) region. This information is processed by a command generator which provide possible initial state and assertions to the silicon debug tool. The silicon debut tool in turn generates configurations, in the form of bitstreams, which are sent into the reconfigurable logic of the ICUT. There, the assertions in effect monitor selected signal behavior of the user logic under test, which is be stored as a "trace." This "actual" trace passes to the silicon debug tool to be formatted from a bitstream format to a format where user signal names are the same as the corresponding ones in the user design description. This trace is then translated in a trace that the Model Checker, uses to restart its analysis.

DETAILED DESCRIPTION OF THE PREFERRED EMBODIMENTS

Figure 1:
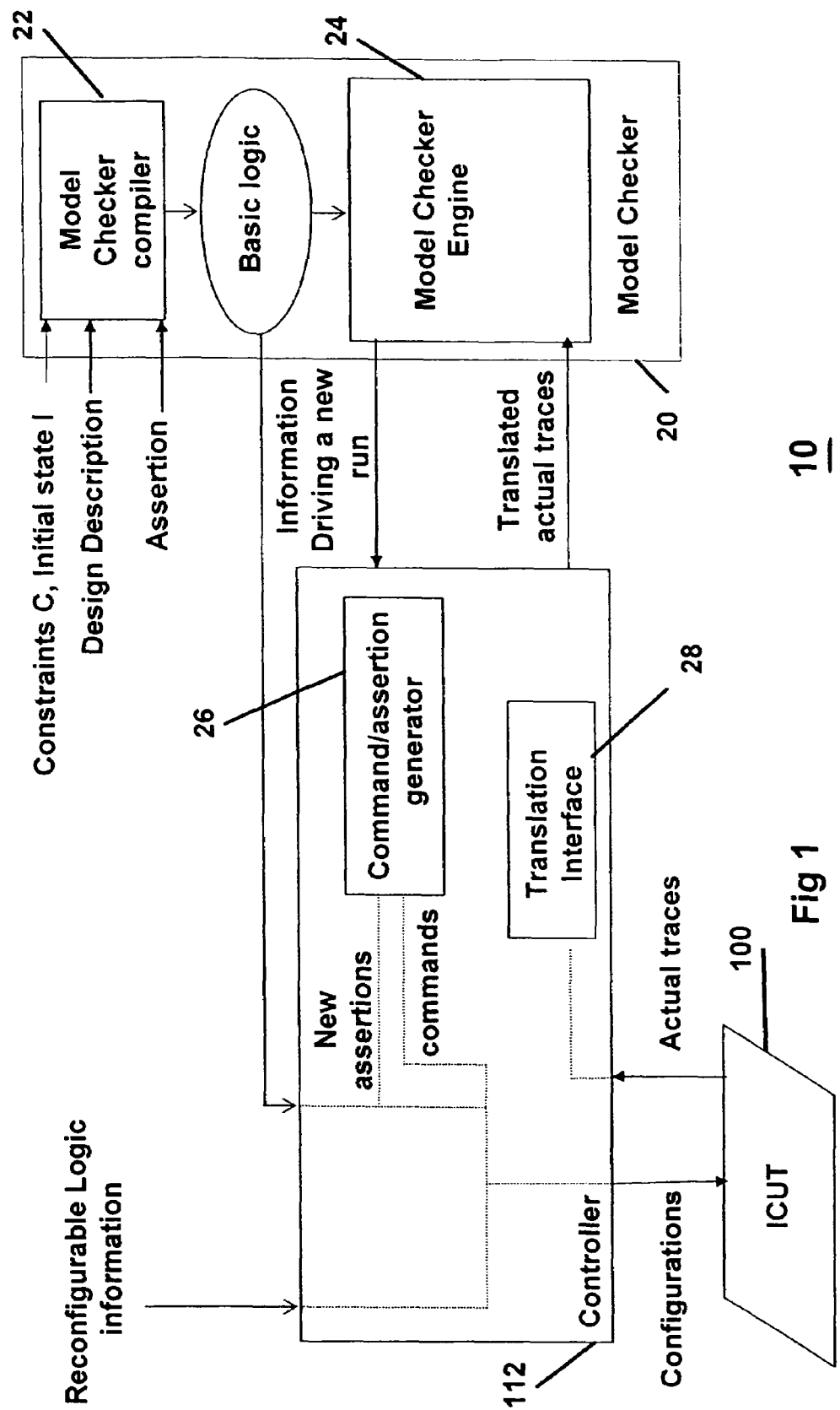
FIG. 1 illustrates a block diagram of a system for analyzing an integrated circuit according to one preferred embodiment of the present invention.

An integrated circuit design and manufacturing process flow generally includes: (i) generating an abstract level design description, and then on RTL level description of the design, which is a description of a digital electronic circuit; (ii) verifying the design model to verify the design description by simulation, and sometimes by using a Formal methods including a Model Checker; (iii) synthesizing the design description which is turned into a gate level description of the integrated circuit; (iv) creating a layout of the design and then a transistor level description; and (v) fabricating the integrated circuit, which is manufactured on a chip. After a first fabrication, comes a phase of analyzing, testing and debugging which most of the time leads to one or several expensive respins (i.e. new fabrications) of the chip.

The present invention provides a system and method for analyzing, testing and debugging integrated circuits, using model checking, based at least in part on information from an actual integrated circuit chip on chip, i.e. after a first fabrication of the circuit. In one form, the analysis, test, abd debug are performed on a closed loop basis.

The system and method in one form, is adapted for analyzing an instrumented user logic in an integrated circuit under test (ICUT).

The ICUT includes a user logic (UL) region and a debug logic (DL) region. The user logic (UL) region includes a logic circuit operable synchronously with an applied periodic clock. The logic circuit has a plurality of nodes and one or more UL signal lines, each of these UL signal lines extending from an associated one of said nodes. Signals on one or more of said UL signal lines are representative of binary values at the associated nodes as a function of time.

The debug logic (DL) region includes a tracer, a reconfigurable logic (RL) a reconfigurable test router and reconfigurable logic. The reconfigurable logic has one or more reconfigurable logic (RL) input lines, coupled to the reconfigurable router. The tracer has one or more tracer (T) input lines. The tracer is responsive to signals on one or more of the T input lines to generate ICUT-based traces, where the ICUT-based traces are representative of a succession of states of the user logic circuit over a plurality of clock periods.

The reconfigurable router is responsive to an applied router configuration signal to couple selected ones of the UL signal lines to selected ones of the T input lines.

The reconfigurable logic is responsive to an applied assertion analysis control signal to generate an assertion evaluation signal which is representative of an evaluation of one or more applied assertions over a succession of clock cycles. The reconfigurable logic is also responsive to control signal manage the trace (decide when to start and stop a trace).

The system and method incorporate a Model Checker, for example, of the type described above, and a Controller. The Controller interfaces between an ICUT (that is, a physical (e.g., in silicon) integrated circuit) and the Model Checker. The ICUT can also be implemented as an FPGA. In its Model Checker compiler, the Model Checker is responsive to an applied design description for the ICUT, applied constraints C, an initial state I, and at least one applied assertion, to generate the basic logic. The basic logic relative to the assertion to be proven is preferably applied to both a Model Checker engine in the Model Checker, and to the Controller.

Utilizing the basic logic, the Model Checker engine proceeds in its analysis by commencing from the initial state I, and progresses through the reachable states, evaluating the assertion at each step, until a predetermined criterion (usually time) is reached, generating a reachability graph for the circuit defined by the design description. From the graph, the Model Checker engine easily generates traces, which represent any cycle-based possible simulations of the behavior (assertion proven or not) expected of the design.

The Controller processes the basic logic relative to the applied assertion(s) and initial state and generates configuration signals. The configuration signals are applied to the ICUT and are appropriate to configure the RL region and the T region of the ICUT, so that the ICUT starts at the specified initial state I and progresses through from clock cycle to clock cycle through its states which are reachable from that initial state, while the tracer stores traces of selected signals for transfer back to the Controller. Those "ICUT-based" traces represent the actual Boolean signal values, (which appear on the UL signal lines) which occurred in the ICUT, i.e., the physical chip. Assertion evaluations associated with the traces are developed "on-Chip" in the reconfigurable logic. Those evaluations may be transferred to the Tracer in the form of assertion evaluation signals.

The ICUT-base traces received at the Controller are formatted and transferred back to the Model Checker engine, where they can be used as a guidance in order to be reproduced by the Model Checker engine based on the design for the ICUT. By "reproducible" it means that the Model Checker generates a model-checker-based trace which is the same or equivalent to the ICUT-based trace generated on-chip. If the actual traces are reproducible, then the basic logic and the physical chip (ICUT) are consistent, at least for the region over which the engine performed its analysis and the Model Checker will be able to resume its analysis, this time from a new initial stage derived from the actual trace. Doing so, the Model Checker will at the very least improve the coverage of the verification. If the ICUT-based and Model Checker-based traces do not match, that is indicative of either a physical defect in the chip or a functional error in the basic logic used by the Model Checker or a flaw in the verification system itself.

The processing in the ICUT is on the one hand much faster than the progression through the reachable states performed by the Model Checker engine based on the basic logic of the design. It is this relatively slow processing (despite a number of heuristics to handle a very large number of states which are reachable) which provides limitations to prior art analysis of integrated circuits. On the other hand, it provides an actual trace and not being able to reproduce it using a Model Checker is a very valuable debug information in itself.

With the present invention, "actual", and very deep, traces are generated at very high speeds from the ICUT itself. Accordingly, the Model Checker engine can complete its predetermined time processing of the basic logic without ever reaching states easily processed by the ICUT. A new initial state (which may for example be based on detection of an assertion failure) derived from the trace received from the ICUT is determined (either at the Controller level or at the Model Checker level) for the Model Checker engine to continue and extend its processing, which is well beyond that which it could ordinarily reach during its normal processing. Thus, with the invention being based on actual traces from a real chip, produced at very high speed, additional analysis may be performed reaching new states recognized as being of interest for verifying the circuit with an improved coverage. This even creates an opportunity for the Model Checker to find a failure for the assertion among the states that were uncovered before or even to complete its analysis and provide a proof that the assertion never fails.

Moreover, in the event of a failure detected during the processing of the chip, the Model Checker can be used to enrich the amount of information about the failure by setting up repeated analysis from or near states where the failure was detected, the Model Checker can establish different traces to reach the same failure or find new states where the failure appears.

Table 1 below outlines the conclusions and next actions for the Model Checker engine in response to conclusions made by the Model Checker engine with respect to a trace being reproducible or not (i.e., A Model-Checker-based trace matches the ICUT-based trace from the ICUT), and with an assertion failing or not, for analysis at a given state.

If a trace is reproducible and an assertion has not failed, that indicates that to the extent evaluation has progressed, the design description and the ICUT correspond and there is no detected physical defect, error in design description or verification system flaw. As a next action the Model Checker engine progresses to analysis for a next reachable state in the subset from a state of interest derived from the trace. The Model Checker engine can provide analysis in new subsets of the state space, which new subsets can be significantly different from the already-evaluated subsets.

If a trace is reproducible and an assertion has failed in a given state, that indicates that a functional error has been detected. As a next action, the Model Checker engine can perform further analysis by generating a new trace leading to the same state where the assertion is failing or leading to neighboring new state where the assertion is also failing. This type of new information is of great value for the user to locate where in the circuit the functional error resides and understand how to fix it.

If a trace is not reproducible, whether the assertion has failed or not, that indicates that there is a physical defect in the ICUT, or an inconsistency between the ICUT and the design description, or a flaw in the verification system. It must be determined which of the three assumptions is correct. When the trace is non reproducible and the assertion does not fail, the event of a physical defect is unlikely and must be paired with another problem.

TABLE 1

|  | Trace reproducible | Trace non-reproducible |
| --- | --- | --- |
| Assertion failed | A functional error is detected | Physical defect Error in design description Verification system flaw |
| Next Action | Run Model Checker and enrich the information leading to locate the error | Refine where problem resides |
| Assertion not failed | Step forward in validating assertion | Physical defect Error in design description Verification system flaw |
| Next Action | Run Model Checker and enrich coverage | Refine where problem resides |

FIG. 1 illustrates a block diagram of the system 10 for analyzing and/or verifying a user logic region of an integrated circuit under test (ICUT) (hereinafter referred to as an analyzing system). As shown in FIG. 1, the analyzing system 10 is coupled to the ICUT (or chip) 100. The ICUT 100 may for example be a multi-core data processing structure on a semiconductor chip such as a microprocessor. The analyzing system 10 according to the present invention can be used to analyze a particular instrumented portion (or region) or any part of the logic circuit on the ICUT, or the whole circuit, as desired by a user as long it has been instrumented (i.e. connected relevant signal with the Reconfigurable Logic. The term "core" designates pre-packaged design modules that a designer of an integrated circuit employs, usually without any changes.

Figure 2:
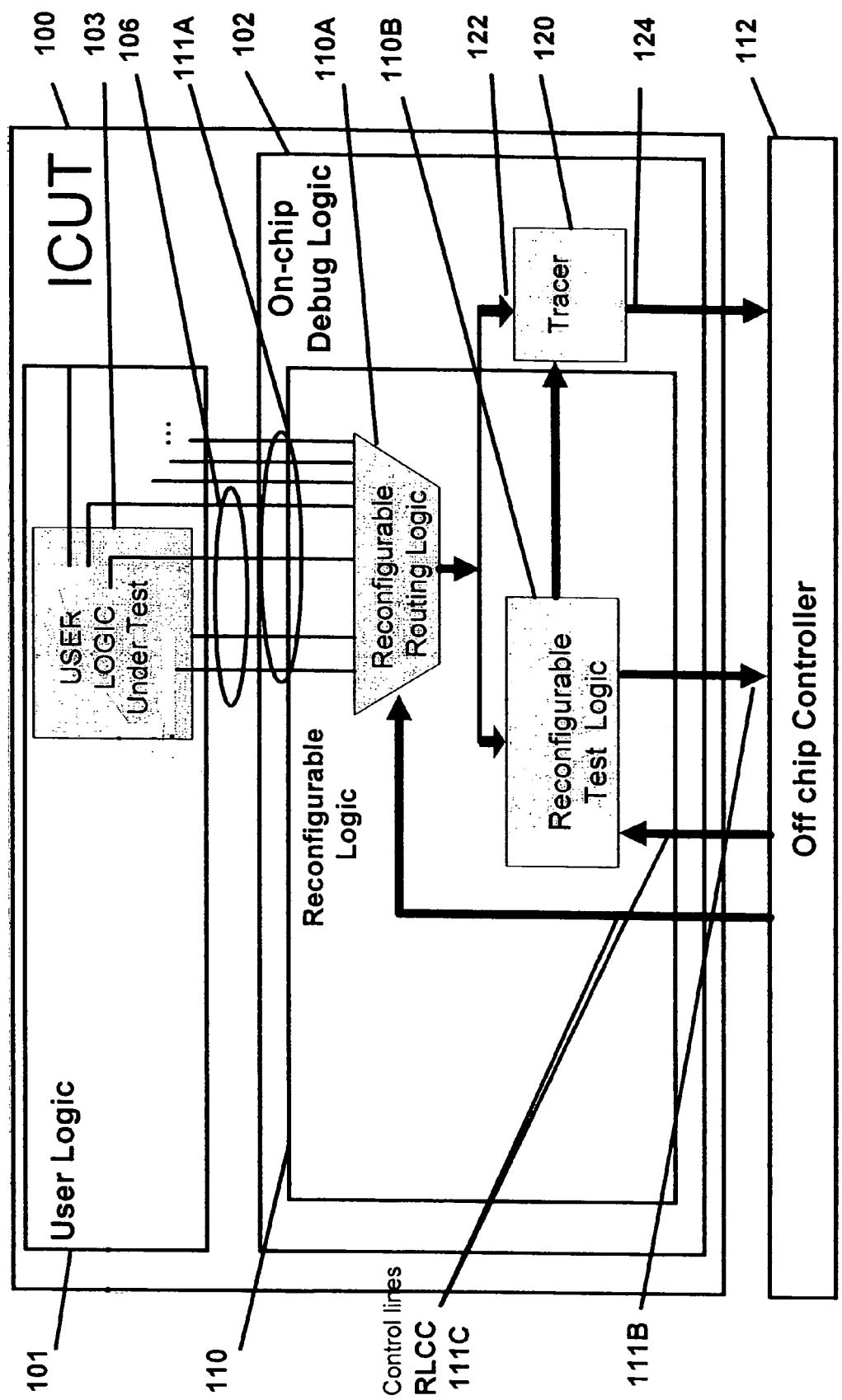
FIG. 2A illustrates a block diagram of an integrated circuit under test according to one aspect of the present invention.
FIG. 2B illustrates a block diagram of an integrated circuit under test according to another aspect of the invention.
Figure 2B:
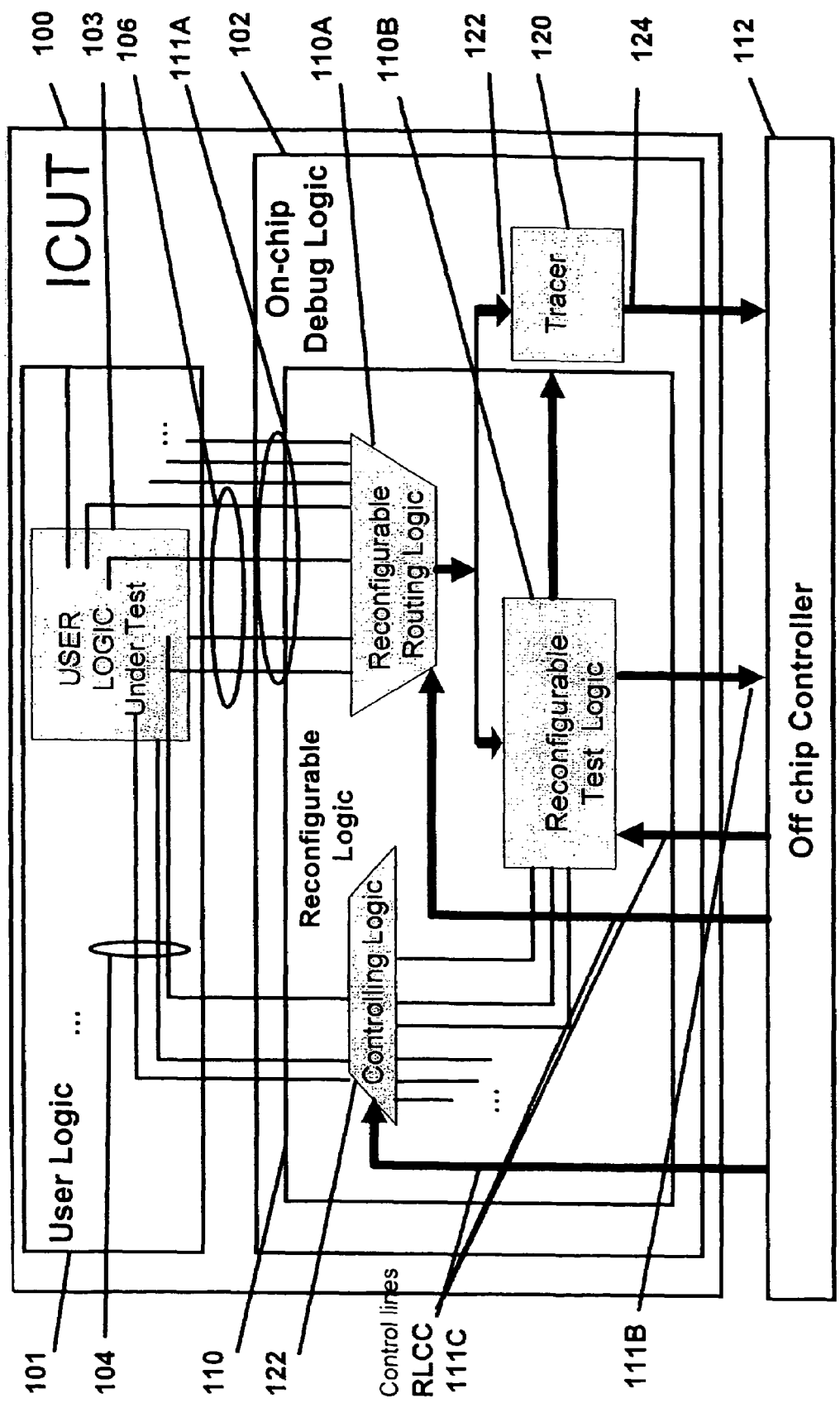

FIGS. 2A and 2B illustrates a block diagrams of the ICUT 100 in two forms. FIG. 2A shows a configuration adapted for monitoring activity in an ICUT 100, to analyze that integrated circuit. As shown in FIG. 2A, the ICUT 100 includes a user logic region 101 and an on-chip debugger logic region 102. The user logic region 101 includes a user logic (UL)-region-under-test 103. The UL region 103 has an associated set of output lines (UL output lines) 106. FIG. 2B shows a similar arrangement to that in FIG. 2A, but additionally includes a closed loop including logic region 101, where UL region 103 includes an associated set of input lines (UL input lines) 104, arranged so that the debug logic 102 under control of the controller 112 can change or control the value of selected input signals 104 of the UL region 103, using a controlling logic 122.

The on-chip debugger logic region 102 includes a reconfigurable logic (RL) region 110, which includes a reconfigurable routing logic region (RRL) 110A and reconfigurable test logic region 110B. RL region 110 has input lines (RL input lines) 111A and output lines (RL output lines) 111B, which are coupled the output lines 106 of the UL region 101. RL region 110 further includes reconfiguration logic configuration control (RLCC) lines 111C. The regions 110A and 110B are reconfigurable in that, in one preferred form, they include at least one multi-state switch interconnecting at least two nodes. The switch is operable in a first state to establish a first architecture in response to a reconfiguration signals applied to the RLCC lines 111C and is operable to be in a second state to establish a second architecture in response to a different form of the reconfiguration signals applied to the RLCC lines 111C. In various embodiments, the reconfigurable logic may be adapted to be configured to many different states as controlled by a user. The state of the region RL 110 and is controlled by (off-chip) Controller 112, which is coupled to the RL region 110 of ICUT 100. Through the Controller 112, a user may reconfigure the RL region 110, and thereby to reconfigure at least some initial values of the UL region 101.

The ICUT 100 further includes a tracer 120 having input lines (T input lines) 122 and output lines (T output lines) 124. The input lines of the tracer 120 are coupled (by way of RRL 110A) to the input and output lines 104 and output lines 106 of the UL region 101. The tracer 120 is controlled from the Controller via the reconfigurable logic 110B where the user can program trigger conditions to start or stop tracing and is adapted to generate traces of selected signals of the user's particular interests which are representative of actual signals on selected ones of the input and output lines 104 and output lines 106 of the UL regions 103. For example, the user may run assertions to check the UL region 103, and the tracer 120 generates traces from points within the UL region 103. These traces are used, as described below, by the Model Checker engine 24 to determine if they are reproduceable and enrich (or accelerate) its analysis.

According to one aspect of the present invention, as shown in FIG. 1, the analyzing system 10 includes a Model Checker 20 for analyzing the core UL region 103 in the ICUT 100. The Model Checker 20 can be implemented in a computer system. The Model Checker 20 includes a Model Checker compiler 22 responsive to a design description including a UL region 103, and at least one applied assertion signal, representative of an assertion, optionally constraints C, and, an initial state I, to generate a "basic logic" model of the design description and the applied assertion, subject to C and I. The Model Checker 20 further includes a Model Checker engine 24. The Model Checker engine 24 receives the basic logic from the Model Checker complier 22 and also receives the actual (chip) traces (formatted in a readable format for the Model Checker and adapted to the basic logic representation of the design and states) from the tracer 120, and computes, analyzes and evaluates assertions using the basic logic. Traces build by the Model Checker are referred to herein as Model Checker-based traces (as opposed to the ICUT-based traces stored and delivered by tracer 120).

In one preferred embodiment as shown in FIG. 1, the Controller 112 further includes a command/assertion generator 26 responsive to the Model Checker engine 24. The Model Checker engine 24 manipulates a unique set of information to derive an efficient new test for the UL region 103 by sending a potential new initial state, triggering conditions, and assertion to the command/assertion generator 26. The command/assertion generator 26 receives the information driving a new test and generates new configurable (i.e. in term of observable signals) assertions and commands to be applied by the Controller 112 to the on-chip Debug Logic 102 in response to the received information. The Controller 112 is configured to generate signals representative of the new assertions and commands, in a bitstream format and send the bitstream signals to the RL region 110 on the ICUT 100. The assertions are relative to observable signals of the UL region 103 and can be selected together with other observable signals of the UL region 103 at least one trace is generated to record the signals on selected lines of UL region 103. The tracer 120 generates traces that pertain to the assertion failures, so that the actual (on chip) assertion failures can be reproduced and its analysis can be refined by the Model Checker engine.

The Controller 112 may further include a translation interface 28 connected to the Model Checker engine 24 The traces generated by the tracer 120 on the ICUT 100 are in a bitstream format. In one preferred embodiment, the translation interface 28 formats the bitstream traces into a format which is first compatible with the format of the design description for the UL region 103, so that the Model Checker engine 24 or possibly other analysis tool or method may readily use the traces on its analysis. The bitstream traces are sent to the translation interface 28, which translates the traces into a format that is also compatible with the basic logic of the Model Checker engine 24. This last level of compatibility can sometimes be different and difficult to reach and a lack of attention to this problem of translation can lead to verification system flaws as described in Table 1.

The basic logic relative to the initial state and assertion by the Model Checker compiler 22 is applied to the UL region 102 through the Controller 112. Preferably, the basic logic applied to UL region 102 is the same basic logic representation applied to the Model Checker engine 24. Sharing the same basic logic representation between the Model Checker engine 24 and the UL region 103 is important to greatly ease the decision about the reproducibility of traces coming from the ICUT by the Model Checker engine 24.

Referring to FIG. 1, the diagram also illustrates an integrated circuit analysis and/or verification process method of the present invention. To analyze and debug a user's integrated circuit (e.g., the UL region under test) in the ICUT 100, an RL region 110 is first created and placed on chip to observe and control important signals of the UL region 103 (shown in FIG. 2). A tracer 120 is also coupled to the UL region 103 and the RL region 110. The RL region 110 and the tracer 102 preferably, but not always, are integrated in the design model in the chip design phase, and are integrally fabricated with the UL region 103 on the chip. A Controller 112, which includes a processor for reprogramming the RL region 110, is connected to the RL region 110 and the tracer 120.

In accordance with the process/method of the invention, the user applies a design description signal representative of the design of the UL region 103, at least one assertion to the Model Checker compiler 22, and constraints (C) and optimally, an initial state (I). The design description representative of the design of the UL region 102, preferably is an RTL or a gate level description that region, but can be other software models of the region 103 which are compatible with the Model Checker Compiler. The applied assertion description is synthesizable such that its basic logic may be used to configure Reconfigurable Logic 110; it is described in a language accepted by the Model Checker compiler. The assertion used in the present invention can be specially designed for testing the UL region 103.

In one preferred form, the assertion is created based on the design description of the UL region 103. The Model Checker compiler 22 translates the RTL description of the UL region 103 and the assertion, together with C and I, to form the basic logic. The basic logic relative to the initial state and assertion is then applied to the Controller 112, which generates and applies to the ICUT, the bitstream necessary to reconfigure RL region 110 to select observable signals from the UL signal lines and apply them to tracer 120, and to set UL region 103 to the appropriate initial state.

The ICUT is driven to progress at system speed, clock cycle after clock cycle, over states reachable from the applied initial state. As that progression proceeds, the pertinent portion of the traces (i.e., containing the states of interest), are transferred via Controller 112 back to Model Checker engine 24. Model checker engine 24 evaluates the ICUT-based trace to determine whether it can reproduce the ICUT-based trace or not, in conjunction with Table 1. As described above, the verification system 10 may again generate new assertions and apply the new assertions to the UL region 103. Doing so creates a "dialog" between the Model Checker and the ICUT, where the ICUT provides information never before accessible. The Model Checker exploits that information and considerably improves its analysis, compared to the prior art, and extracts a new set of information to drive the ICUT toward new uncovered states.

Figure 3:
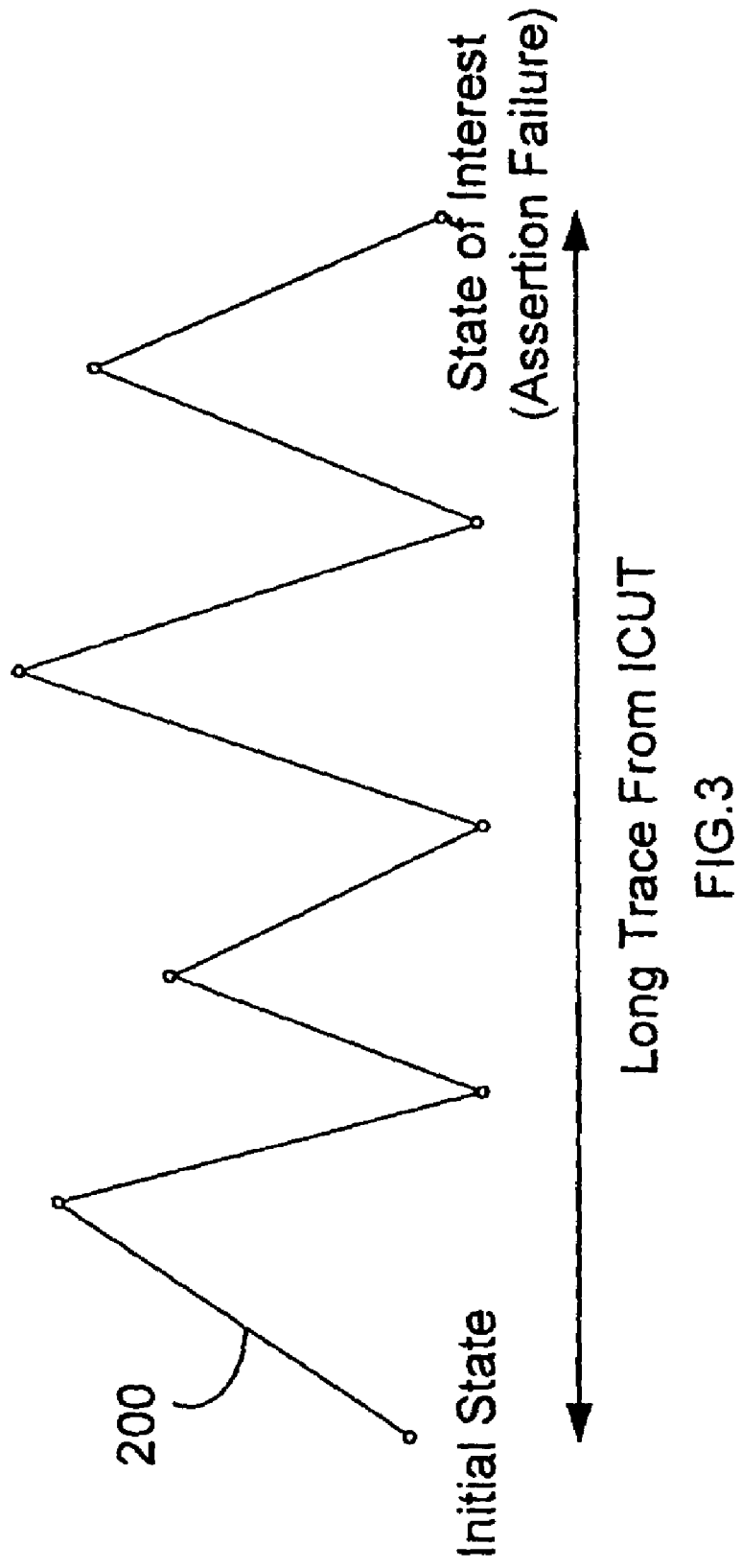
FIG. 3 schematically shows a graph representing a trace according to one preferred embodiment of the present invention.

FIG. 3 schematically shows a graph representing a trace 200 under analysis by the Model Checker engine 24. The trace 200 in FIG. 3 consists of many states and transitions, where the states represent states of an integrated circuit design. Particular states of interest are represented by nodes in FIG. 3. As shown in FIG. 3, the trace shows passage from state S1 through many states (where an edge schematically represents many states and transitions, and a node is a state of interest) until reaching state SI, where an assertion has been determined to have failed.

It is critical for the Model Checker to be able to reproduce the illustrated ICUT-based trace of FIG. 3, in its reachable state graph. If for example, using the trace/graph of FIG. 3, the Model Checker-based trace matches the ICUT-based trace of FIG. 3 until reaching SI, then the analysis would be in the upper left block of Table 1.

Figure 4A:
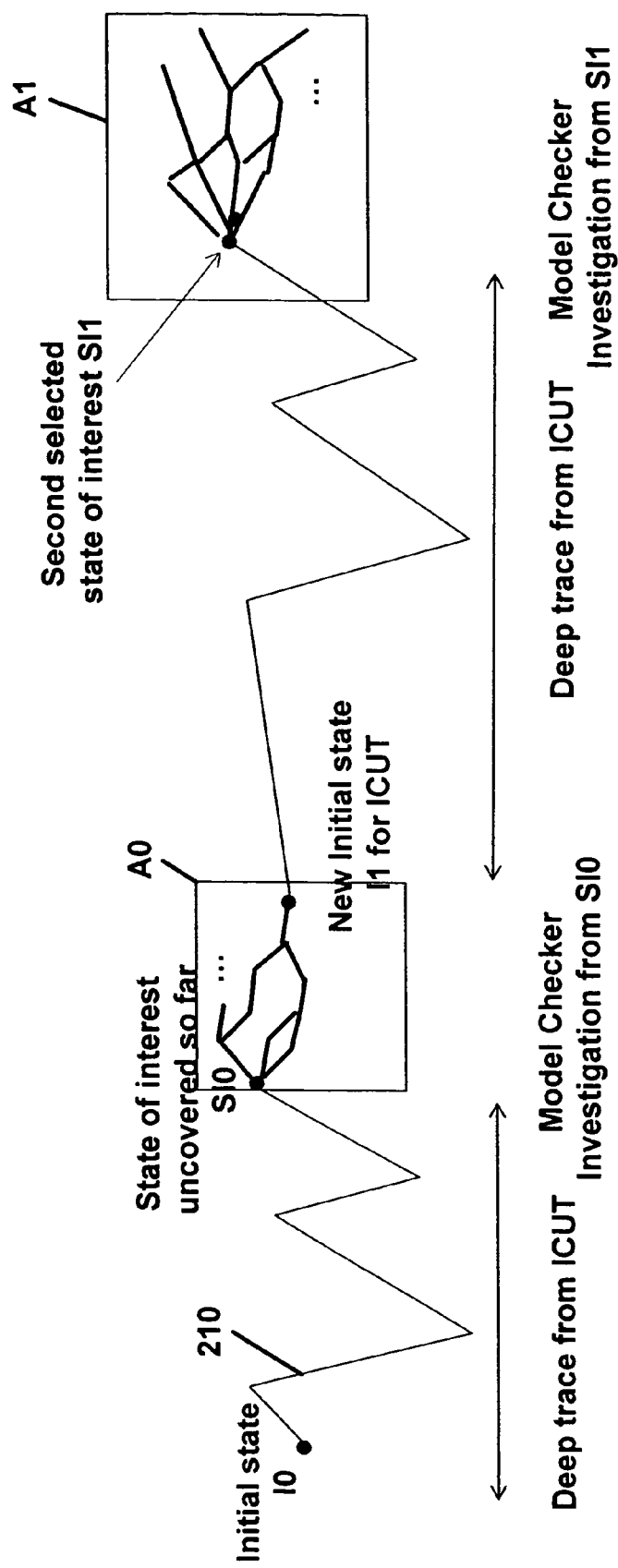
FIG. 4A schematically shows a graph representing a trace according to another preferred embodiment of the present invention and FIG. 4B schematically shows a graph representing a trace in the embodiment of FIG. 4A, wherein a failed assertion occurs.

FIG. 4A illustrates the result of the dialog between the Model Checker and ICUT. The trace 210 of FIG. 4A starts with a deep (long) trace coming from ICUT from an initial state I0 to a state of interest SI0. SI0 is selected for the Model Checker engine to determine if there is an assertion failure in the neighborhood of SI0. The Model Checker then explores a subset AO of reachable states from state SI0. The Model Checker then defines a new initial state I1 for further investigation by ICUT. ICUT is set to state I1 and then generates a new trace, starting from I1 and continuing until the next state of interest SI1. At SI1, the Model Checker defines a new subset of reachable states A1 for further investigation. As noted above, subset A1 may be remote from subset AO, and may permit analysis, over reasonable time periods, of disparate portions of the reachable state space associated with the basic logic.

Figure 4B:
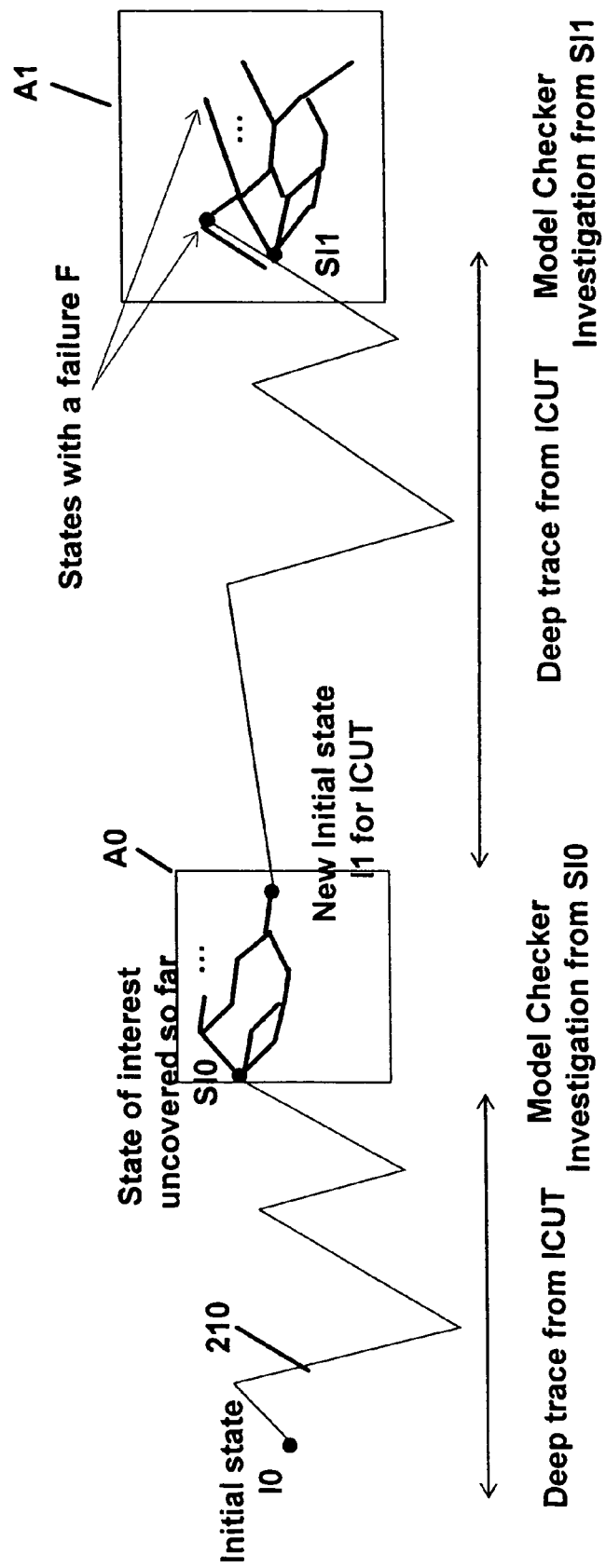

Alternatively, as depicted in FIG. 4B, in the event of an assertion failure F at state SI, the Model Checker engine 24 may start its exploration at a state SI1 which is a few states before the failure to better analyze the failure. This permits detailed analysis of a region of interest where a failure exists in the state space associated with the basic logic.

Figure 5:
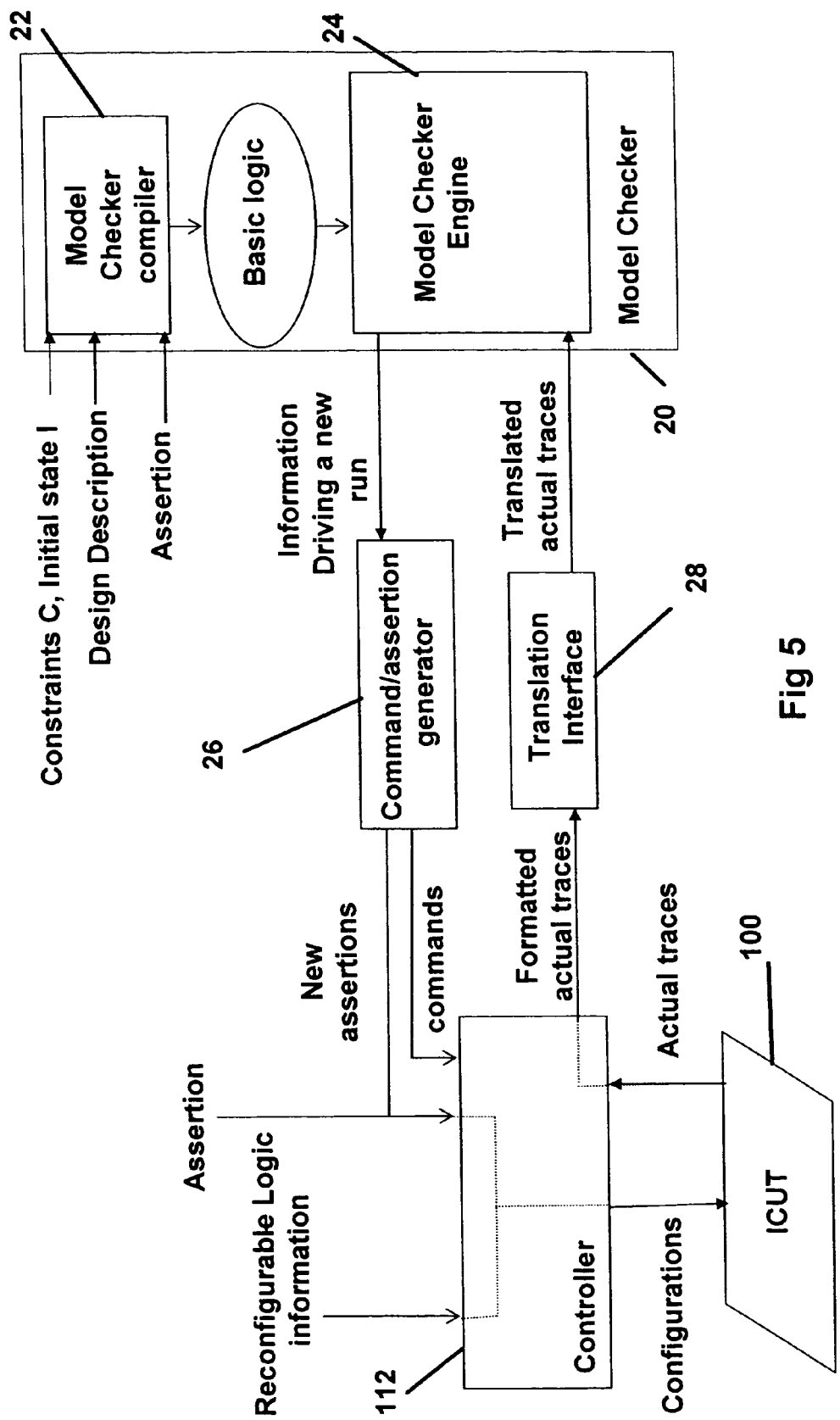
FIG. 5 illustrates a block diagram of a system for analyzing and verifying an integrated circuit according to another preferred embodiment of the present invention.

FIG. 5 illustrates an alternative embodiment, in which an assertion is directly applied to the Controller 112 without being processed by the Model Checker compiler 22. In this embodiment, the applied assertion needs to be translated twice, once by the Model Checker 20 and once by the Controller 112, this embodiment is to be used for instance, when the Model Checker 20 does permit access to its basic logic; or more generally when the integration between the Model Checker and the controller cannot be completed at a desired level.

While the claimed invention has been described in detail and with reference to specific embodiments thereof, it will be apparent to one of ordinary skill in the art that various changes and modifications can be made to the claimed invention without departing from the spirit and scope thereof. Thus, for example those skilled in the art will recognize, or be able to ascertain, using no more than routine experimentation, numerous equivalents to the specific substances and procedures described herein. Such equivalents are considered to be within the scope of this invention, and are covered by the following claims.

What is claimed is:

1. A system for analyzing user logic in an integrated circuit under test (ICUT), said ICUT including:
   a user logic (UL) region including a logic circuit operable synchronously with an applied periodic clock, said logic circuit having a plurality of nodes and one or more UL signal lines, each of said UL signal lines extending from an associated one of said nodes, wherein signals on one or more of said UL signal lines are representative of binary values at said associated nodes as a function of time, and
   a debug logic (DL) region including:
      a tracer having one or more tracer (T) input lines, wherein said tracer is responsive to signals on one or more of said T input lines to generate ICUT-based traces, said ICUT-based traces being representative of a succession of states of said user logic circuit over a plurality of cycles of said periodic clock,
      a reconfigurable router responsive to an applied router configuration signal to couple selected ones of said UL signal lines to selected ones of said T input lines,
      a reconfigurable logic responsive to an applied assertion analysis control signal to generate an assertion evaluation signal representative of an evaluation of one or more applied assertions over a succession of clock cycles,
   wherein said system comprises:
      A. a model checker compiler responsive to an applied design description for said ICUT, zero, one or more applied constraints C, an applied initial state I, and one or more applied assertions, to generate basic logic,
      B. a model checker engine responsive to said basic logic to (i) construct a state graph extending from said applied initial state I and representative of plurality of reachable states for said design description with respect to said applied constraints C, and (ii) evaluate said assertions over a subset of said states reachable from said initial state I, and to generate model checker-based traces representative of said evaluation of said assertions over said subset, and
      C. a controller responsive to said basic logic relative to I, C, and said assertions, to generate said router configuration signal for application to said reconfigurable router of said ICUT and transfer said router configuration signal to said reconfigurable router, and being adapted to receive said ICUT-based traces and transfer said received ICUT-based traces to said model checker engine, and
   wherein said controller is responsive to said model checker engine to generate said assertion analysis control signal and apply said assertion analysis control signal to said reconfigurable logic.

2. A system according to claim 1
   wherein said tracer is reconfigurable in response to an applied tracer configuration signal, wherein said reconfigurable logic is responsive to an applied tracer control signal to generate said tracer configuration signal and to apply said tracer configuration signal to said tracer, and wherein said controller is responsive to said model checker engine to generate said tracer control signal and apply said tracer control signal to said reconfigurable logic.

3. A system according to claim 1 wherein said ICUT further includes:

controlling logic coupled to one or more of said UL signal lines and responsive to an applied initial state signal to generate a UL control signal and apply said UL control signal to said UL region to effect said initial state in said UL region, and wherein said controller is responsive to said model checker engine to generate said initial state signal and is adapted to apply said initial state signal to said controlling logic.

4. A system according to claim 3 wherein said controlling logic is reconfigurable in response to a controlling logic signal from said controller, and wherein said controller is responsive to said model checker engine to generate said controlling logic signal and is adapted to apply said initial state signal to said controlling logic.

5. A system according to claim 1 wherein said model checker engine includes means for determining whether a model checker-based trace is a reproduction of said ICUT-based trace.

6. A system according to claim 5 wherein said model checker engine includes means responsive to said determination, for generating a new initial state, and for applying said new initial state to said Controller, and wherein said Controller includes means responsive to said applied new initial state for generating a new configuration signals and for applying said new configuration signals to said DL region of said ICUT.

7. A system according to claim 5 wherein said model checker engine includes means responsive to said determination, for generating a new assertion, and for applying said new assertion to said Controller, and wherein said Controller includes means responsive to said applied new assertion for generating a new configuration signals and for applying said new configuration signals to said DL region of said ICUT.

8. A system according to claim 7 wherein said model checker engine includes means responsive to said determination, for generating a new initial state, and for applying said new initial state to said Controller, and wherein said Controller includes means responsive to said applied new initial state for generating a new configuration signals and for applying said new configuration signals to said DL region of said ICUT.

9. A system according to claim 5 wherein said model checker engine includes means responsive to said determination, for generating a new initial state and a new assertion, and for applying said new initial state and said new assertion to said Controller, and wherein said Controller includes means responsive to said applied new initial state and said new assertion for generating a new configuration signals and for applying said new configuration signals to said DL region of said ICUT.

10. A system according to claim 1 wherein said model checker engine includes means responsive to said ICUT-based trace, for identifying an assertion failure and a state of said ICUT associated therewith, and for generating a new initial state corresponding to a state of said ICUT prior to said state associated with said assertion failure in said graph, and for redeveloping said basic logic by defining said graph extending from said new initial state.

11. A system according to claim 10 wherein said model checker engine includes means for determining whether a model checker-based trace is a reproduction of said ICUT-based trace.

12. A system according to claim 11 wherein said model checker engine includes means responsive to said determination, for generating a new assertion, and for applying said new assertion to said Controller, and wherein said Controller includes means responsive to said applied new assertion for generating a new configuration signals and for applying said new configuration signals to said DL region of said ICUT.

13. A system according to claim 11 wherein said model checker engine includes means responsive to said determination, for generating a new initial state and a new assertion, and for applying said new initial state and said new assertion to said Controller, and wherein said Controller includes means responsive to said applied new initial state and said new assertion for generating a new configuration signals and for applying said new configuration signals to said DL region of said ICUT.

14. A system according to claim 1 wherein said model checking engine, after said evaluation of said assertions over said subset, is responsive to said ICUT-based trace to generate a new initial state, apply said new initial state to said basic logic, evaluate said assertion over a new subset of said states reachable from said new initial state.

15. A system according to claim 14 wherein said model checker engine includes means determining whether a model checker-based trace is a reproduction of said ICUT-based trace.

16. A system according to claim 15 wherein said model checker engine includes means responsive to said determination, for generating a new initial state, and for applying said new initial state to said Controller, and wherein said Controller includes means responsive to said applied new initial state for generating a new configuration signals and for applying said new configuration signals to said DL region of said ICUT.

17. A system according to claim 15 wherein said model checker engine includes means responsive to said determination, for generating a new assertion, and for applying said new assertion to said Controller, and wherein said Controller includes means responsive to said applied new assertion for generating a new configuration signals and for applying said new configuration signals to said DL region of said ICUT.

18. A system according to claim 15 wherein said model checker engine includes means responsive to said determination, for generating a new initial state and a new assertion, and for applying said new initial state and said new assertion to said Controller, and wherein said Controller includes means responsive to said applied new initial state and said new assertion for generating a new configuration signals and for applying said new configuration signals to said DL region of said ICUT.

* * * * *